United States Patent [19]

Ooyama et al.

[11] Patent Number: 4,820,928

[45] Date of Patent: Apr. 11, 1989

[54] LITHOGRAPHY APPARATUS

[75] Inventors: Mitsuo Ooyama, Hachioji; Kimiaki Ando, Ome; Yoshio Kawamura, Kokubunji; Norio Saitou, Iruma; Takanori Simura, Kobe; Hiroyuki Kohida, Kokubunji, all of Japan

[73] Assignee: Hitachi, Ltd., Tokyo, Japan

[21] Appl. No.: 106,499

[22] Filed: Oct. 9, 1987

[30] Foreign Application Priority Data

Oct. 9, 1986 [JP] Japan .................. 61-239005

[51] Int. Cl.$^4$ .................................... H01J 37/302
[52] U.S. Cl. ........................... 250/492.2; 364/491
[58] Field of Search ................. 250/492.22, 492.2; 364/518, 520, 491

[56] References Cited

U.S. PATENT DOCUMENTS 4,280,186  7/1981  Hidai et al. ............... 250/492.22
4,538,232  8/1985  Koyama ................... 250/492.22

Primary Examiner—Bruce C. Anderson
Assistant Examiner—Jack I. Berman
Attorney, Agent, or Firm—Antonelli, Terry & Wands

[57] ABSTRACT

A lithography apparatus in which a charged particle ray such as an electron beam or an ion beam is controlled to scan a desired region of a sample and thereby draw a pattern, including a framing pattern memory for storing therein closed framing lines of a pattern to be drawn in the form of dot images, a framing pattern generator for writing the framing lines of the pattern to be drawn into said framing pattern memory in the form of dot images, and a raster scanning circuit for scanning the framing pattern memory having stored therein closed framing lines of the pattern to be drawn and for generating a beam deflection address for drawing the pattern and a beam blanking control signal.

6 Claims, 12 Drawing Sheets

FIG. 2A
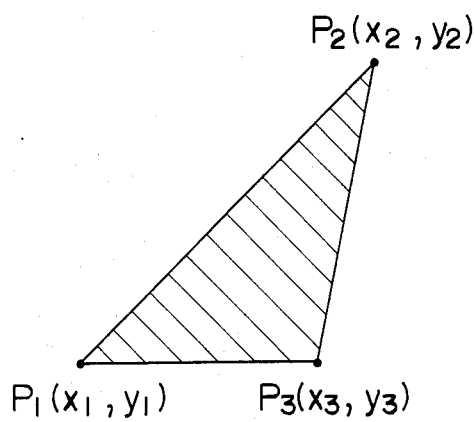
FIG. 2B
| |
|---|
| OP (POLYGON) |
| N (NUMBER OF VERTEXES) |
| $x_1$ |
| $y_1$ |
| $x_2$ |
| $y_2$ |
| $x_3$ |
| $y_3$ |
| EXP (EXPOSURE DESIGNATION) |
FIG. 2C
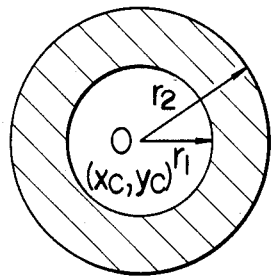
FIG. 2D
| |
|---|
| OP (CIRCLE) |
| $r_1$ |
| $x_C$ |
| $y_C$ |
| OP (CIRCLE) |
| $r_2$ |
| $x_C$ |
| $y_C$ |
| EXP (EXPOSURE DESIGNATION) |

FIG. 9A OUTPUT 250 OF FIRST PLANE 4-1 OF FRAMING PATTERN MEMORY
FIG. 9B OUTPUT 240 OF SECOND PLANE 4-2 OF FRAMING PATTERN MEMORY
FIG. 9C SCANNING CLOCK 245
FIG. 9D OUTPUT 251 OF FLIP-FLOP 47
FIG. 9E OUTPUT 252 OF FLIP-FLOP 48
FIG. 9F BEAM BLANKING SIGNAL 211
FIG. 9G BEAM DEFLECTION ADDRESS 207, 208
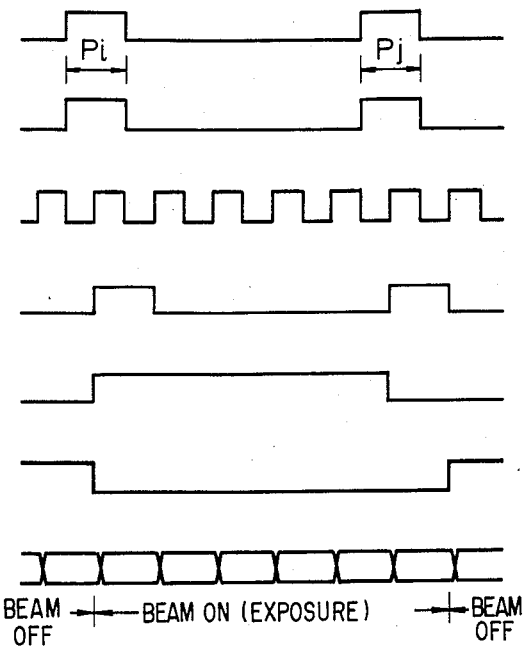
BEAM OFF — BEAM ON (EXPOSURE) — BEAM OFF
FIG. 10
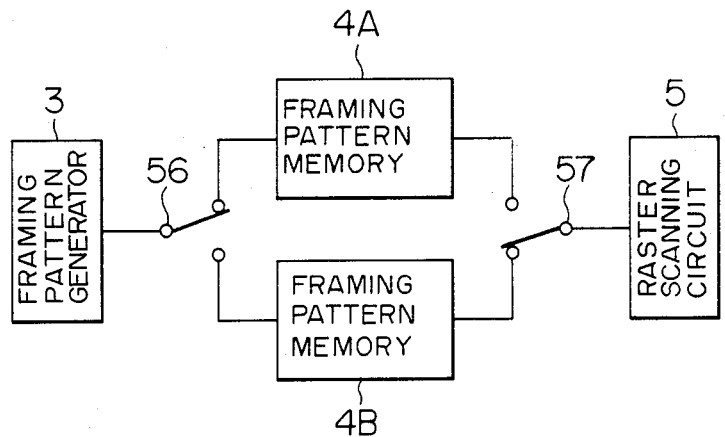

FIG. 11
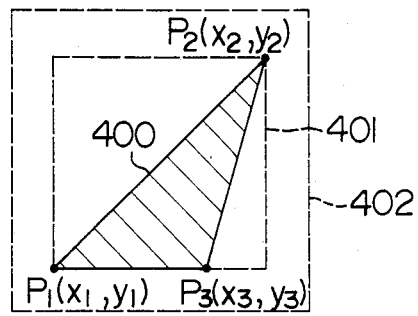
FIG. 12A
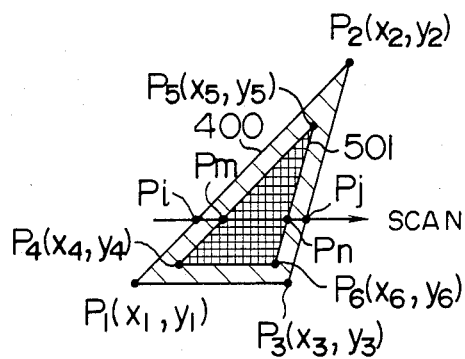
FIG. 12B
| |
|---|
| ⋮ |
| $y_3$ |
| CE (EXPOSURE TIME ALTERATION DIRECTIVE) |
| OP (POLYGON) |
| N (NUMBER OF VERTEXES) |
| $x_4$ |
| $y_4$ |
| $x_5$ |
| $y_5$ |
| $x_6$ |
| $y_6$ |
| EXP (EXPOSURE DIRECTIVE) |

FIG. 15A  OUTPUT 250 OF FIRST PLANE OF FRAMING PATTERN MEMORY

FIG. 15B  OUTPUT 240 OF SECOND PLANE OF FRAMING PATTERN MEMORY

FIG. 15C  OUTPUT 280 OF THIRD PLANE OF FRAMING PATTERN MEMORY

FIG. 15D  SCANNING CLOCK 245

FIG. 15E  BEAM BLANKING SIGNAL 211

FIG. 15F  OUTPUT 282 OF FLIP-FLOP 81

FIG. 15G  BEAM DEFLECTION ADDRESS 207, 208

FIG. 18A  FIG. 18B  FIG. 18C
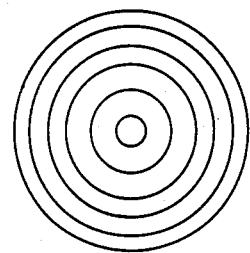 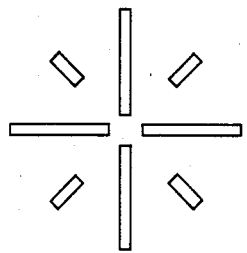 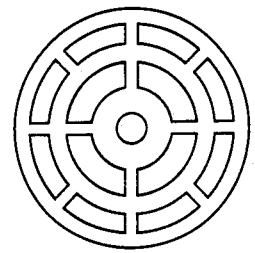
FIG. 19
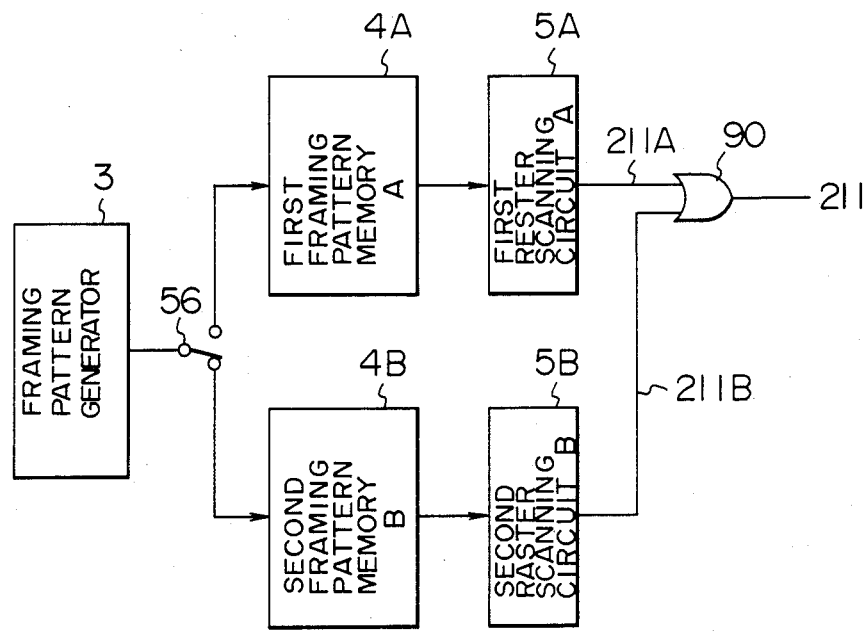

LITHOGRAPHY APPARATUS

BACKGROUND OF THE INVENTION

The present invention relates to a lithography apparatus suitable for drawing at high speed a special shaped pattern including a polygon, having arbitrary angles, a rounded pattern such as a circle or an ellipse, or an arbitrary curve.

In recent years, fields of optical devices such as Fresnel zone plates and magnetic bubble devices have caused increased demand for drawing a special shaped pattern including a polygon having arbitrary angles, a rounded pattern such as a circle or an ellipse, or an arbitrary curve. For drawing such patterns by the prior art, it was necessary to disassemble the pattern to be drawn into a combination of basic patterns such as dots, segments of lines and rectangles by a computer and supply the resultant combination to a lithography apparatus as drawing data. Or it was necessary to prepare special shaped apertures corresponding to the pattern to be drawn as described in JP-A-59-169131.

In the scheme in which special shaped patterns are disassembled in a combination of basic patterns by a computer and transferred to the lithography apparatus as the drawing pattern data, however, the number of basic patterns becomes extremely large and hence it takes a long time to transfer them, resulting in a problem that it takes a long time to draw patterns. When the scheme using special shaped apertures is employed, it is possible to draw patterns having shapes of mounted apertures at extremely high speed. When patterns having special shapes of apertures which are not mounted are to be drawn, however, apertures must be replaced. In fact, therefore, it is disadvantageously difficult to draw patterns including many kinds of special shaped patterns.

SUMMARY OF THE INVENTION

An object of the present invention is to draw special shaped patterns at high speed without disassembling them into combinations of basic patterns.

In order to achieve the above described object, the lithography apparatus in accordance with the present invention comprises a framing pattern memory for storing therein framing lines of a pattern to be drawn in the form of dot images, a framing pattern generator for writing framing lines of patterns to be drawn into the framing pattern memory in the form of dot images, said framing pattern generator including a vector generator and a curve generator, and a raster scanning circuit for drawing by scanning with the beam while scanning the framing pattern memory and emitting the beam only inside framing lines of the pattern to be drawn. At first, framing lines of the pattern to be drawn are stored into the framing pattern memory using the framing pattern generator. Succeedingly, the framing pattern memory is scanned by the raster scanning circuit for drawing. And the beam is irradiate only inside the framing lines of the pattern to draw the desired pattern.

In accordance with the present invention, the pattern to be drawn is defined as the filling-in pattern of a closed pattern surrounded by straight lines or curves. The data of the pattern to be drawn are given in the form of coordinates of vertexes in case of polygons having arbitrary angles, for example. In case of patterns having special shapes, the data of the pattern to be drawn are given in the form of pattern kind, size and positional coordinates. As compared with the case where the pattern is disassembled into a combination of basic patterns, therefore, the amount of data is significantly reduced, resulting in the effect of improved drawing speed. Unlike the scheme in which special shaped apertures are prepared, special shaped patterns can also be defined by drawing data. Accordingly, apertures need not be replaced, resulting in the effect of increased drawing speed. Since framing lines of special shaped patterns can easily be generated by the framing pattern generator comprising the vector generator and the curve generator, various patterns having special shapes can also advantageously be drawn at high speed.

BRIEF DESCRIPTION OF THE DRAWINGS

FIGS. 2A and 2C show examples of drawing of triangular and ring shaped patterns, respectively.

FIGS. 2B and 2D show the configuration of data of the pattern to be drawn.

FIGS. 9A to 9G show the timing in the raster scanning for drawing along one line of the pattern illustrated in FIG. 7 performed by the circuit of FIG. 8.

FIG. 10 shows the connection relation of framing pattern memories, the framing pattern generator 3 and the raster scanning circuit 5 in case a plurality of framing pattern memories are disposed.

FIG. 11 shows the relation between a pattern to be drawin, the possible raster scanning region, and the actual raster scanning region for drawing in the framing pattern memory.

FIG. 12A shows an example of exposure boundary lines established for a triangle.

FIG. 12B shows the configuration of data of the pattern to be drawn illustrated in FIG. 12A.

FIGS. 15A to 15G show the timing in the raster scanning for drawing along one line of the pattern illustrated in FIG. 12A performed by the circuit of FIG. 14.

FIGS. 18A and 18B show patterns used as components of a compound pattern.

FIG. 18C shows an example of a compound pattern.

FIG. 19 shows a circuit for drawing the compound pattern.

DESCRIPTION OF THE PREFERRED EMBODIMENTS

Prior to concrete explanation of embodiments, definition of a pattern to be drawn in accordance with the present invention and an example of configuration of data for drawing will now be described by referring to FIG. 2A.

In accordance with the present invention, a pattern to be drawn is defined as the filling-in pattern of a closed pattern surrounded by vectors or curves, and a polygon having arbitrary angles is defined by supplying coordinates of its vertexes as already described. As an example, the definition of a triangle and the configuration of data of a pattern to be drawn are shown in FIG. 2A. As shown in FIG. 2A, a triangle is defined by supplying coordinates $(x_1, y_1)$, $(x_2, y_2)$ and $(x_3, y_3)$ of three vertexes $P_1$, $P_2$ and $P_3$. At this time, framing lines comprise three segments of lines connecting three vertexes $P_1$, $P_2$ and $P_3$, and the pattern to be drawn comprises the filling-in pattern of the triangle including framing lines as represented by hatching. FIG. 2B shows the configuration of data of the pattern to be drawn. In FIG. 2B, OP denotes a code for representing the kind of pattern (polygon). N denotes the number of vertexes (3 in case of a triangle), and $x_1$ to $y_3$ denote coordinates of vertexes. EXP denotes an exposure directive, which directs to terminate the write operation of framing lines, activate the raster scanning circuit for drawing, and draw the pattern written into the framing pattern memory.

As an example of a pattern including curves, FIGS. 2C and 2D show the definition of a ring-shaped pattern surrounded by two concentric circles and the configuration of data of that pattern to be drawn. The two circles are defined by coordinates $(x_c, y_c)$ of the center O and radii $r_1$ and $r_2$. The two circles represent framing lines of the pattern to be drawn. The pattern to be drawn is represented by hatching and is a ring shaped pattern surrounded by two circles including framing lines. As shown in FIG. 2D, the data of the pattern to be drawn include data for defining two circles commonly having coordinates $(x_c, y_c)$ of center and respectively having radii $r_1$ and $r_2$, and a code EXP for directing the termination of the write operation of framing lines and the start of drawing.

Figure 1:
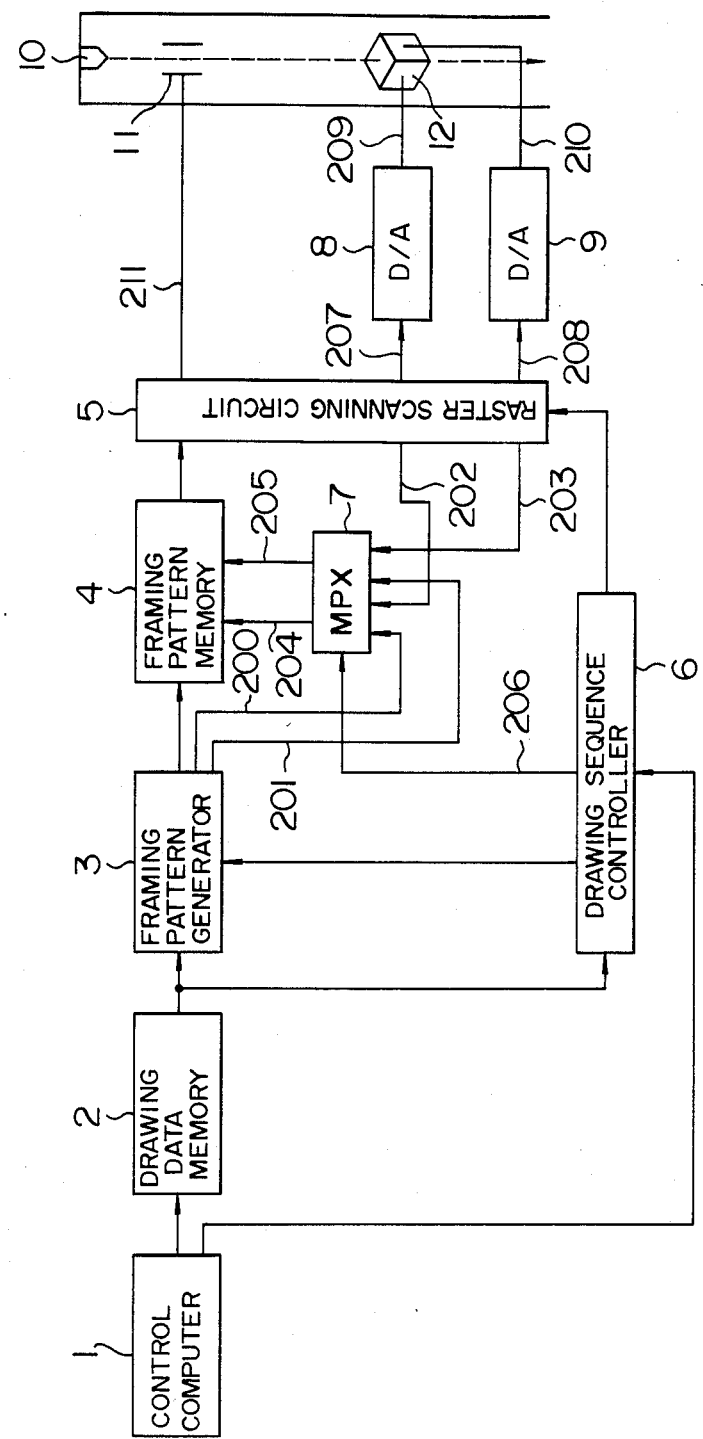
FIG. 1 is a configuration diagram showing the system configuration in an embodiment of the present invention.

FIG. 1 schematically shows a configuration of an apparatus of an embodiment according to the present invention. In FIG. 1, numeral 1 denotes a control computer for supplying data of the pattern to be drawn to the lithography apparatus and for controlling the entire apparatus. Numeral 2 denotes a drawing data memory for temporarily storing therein data of the pattern to be drawn. Numeral 3 denotes a framing pattern generator for writing framing lines of the pattern to be drawn into a framing pattern memory 4 in the form of dot images. Numeral 4 denotes a framing pattern memory for storing therein the framing lines of the pattern to be drawn in the form of dot images. Numeral 5 denotes a raster scanning circuit which scans with a beam while scanning the framing pattern memory 4 which has stored therein the framing lines of the pattern to be drawn. The raster scanning circuits based the framing lines, which controls the beam blanking so as to emit the beam only inside the framing lines thereby drawing a pattern. Numeral 7 denotes a multiplexer for changing over the address supplied to the framing pattern memory 4 depending upon whether the operation is the framing line write operation or the raster scanning operation for drawing a pattern. Numerals 8 and 9 denote digital to analog (D/A) converters for converting beam deflection values generated by the raster scanning circuit expressed in digital values into analog values and for supplying the resultant analog values to a deflector. Numeral 6 denotes a sequence controller for controlling the write operation of framing lines and the sequence of raster scanning for drawing. Numerals 10, 11 and 12 denote a beam source, a blanking plate for turning on or off the beam, and a beam deflector for performing the beam scan, respectively.

The pattern drawing performed in the apparatus shown in FIG. 1 will now be described. At first, data of the pattern to be drawn as shown in FIGS. 2B and 2D are stored into the drawing data memory 2 by the control computer 1. Thereafter, the drawing sequence control circuit 6 is started. The drawing sequence control circuit 6 issues a selection control signal 206 to the multiplexer 7, and selects x address 200 and y address 201 of the framing pattern memory 4 generated by the framing pattern generator 3 to use them as x address 204 and address 205 of the framing pattern memory. Thereafter, the drawing sequence control circuit 6 reads out data of the pattern to be drawn from the drawing data memory 2, and writes framing lines of the pattern to be drawn into the framing pattern memory 4 in the form of a dot image by using the framing pattern generator 3. The write operation of the framing lines is terminated by reading out the EXP (exposure directive) code from the drawing data memory 2. Succeedingly, the sequence control circuit 6 controls the selection signal 206 of the multiplexer 7 so that x address 202 and y address 203 outputted by the raster scanning circuit 5 may be selected as the x address and the y address of the framing pattern memory 4, respectively. The sequence control circuit then starts the raster scanning circuit 5. The raster scanning circuit 5 generates the x address 202 and the y address 203 to scan the framing pattern memory 4. In order to scan with the beam corresponding to the scanning of the framing pattern memory 4, the raster scanning circuit 5 generates x address 207 for beam deflection and y address 208 for beam deflection. These addresses are converted into analog values 209 and 210 by the D/A converters 8 and 9 and supplied to the deflector 12 to scan the beam. Further, the raster scanning circuit for examines the data read out by scanning the framing pattern memory 4, and controls a beam blanking signal 211 so as to emit the beam only to the inside of the framing lines. The desired pattern is thus drawn by filling in the inside of framing lines of the pattern to be drawn.

The framing pattern generator 3 and the raster scanning circuit 5 constituting the primary part of the present invention will now be described in further detail.

Figure 3:
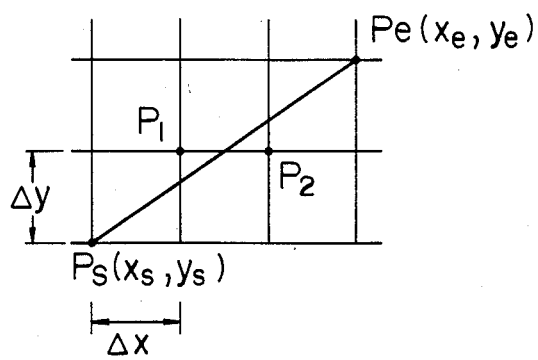
FIG. 3 is an explanation diagram for explaining the function of a vector generator circuit included in the framing pattern generator 3.

Since the framing pattern generator 3 is constituted by vector and curve generators and a framing pattern generator control circuit, the vector and curve generators will now be described at first. As an example of a vector generator, a circuit based upon the Bresenham's algorithm is disclosed in JP-A-58-205276. The function of this circuit will now be described simply by referring to FIG. 3. Inputs to the vector generator are coordinates $(x_s, y_s)$ and $(x_e, y_e)$ respectively of the start point $P_s$ and the end point $P_e$ of a segment of line. If the vector generator is supplied with the coordinates of the start point and the end point and started, the coordinates of the start point are outputted at first. Succeedingly, the straight line connecting the start point with the end point is interpolated by intersections of grids having intervals $\Delta x$ and $\Delta y$ which are located nearest the straight line. Addresses of dots are thus generated one after another. Finally, the address of the end point is generated. Generation of the straight line is thus finished. In FIG. 3, $P_s$ and $P_e$ denote the start point and the end point. $P_1$ and $P_2$ denote interpolated dots.

Figure 4A:
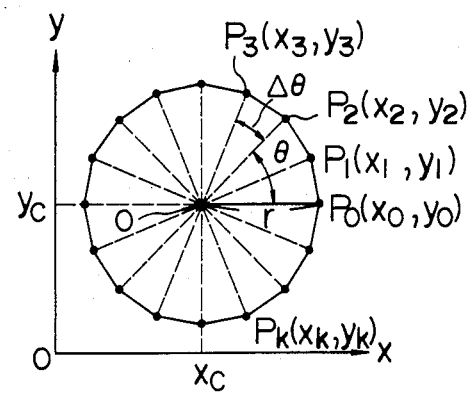
FIG. 4A shows polygon approximation of a circle performed by the framing pattern generator of FIG. 1.
Figure 5:
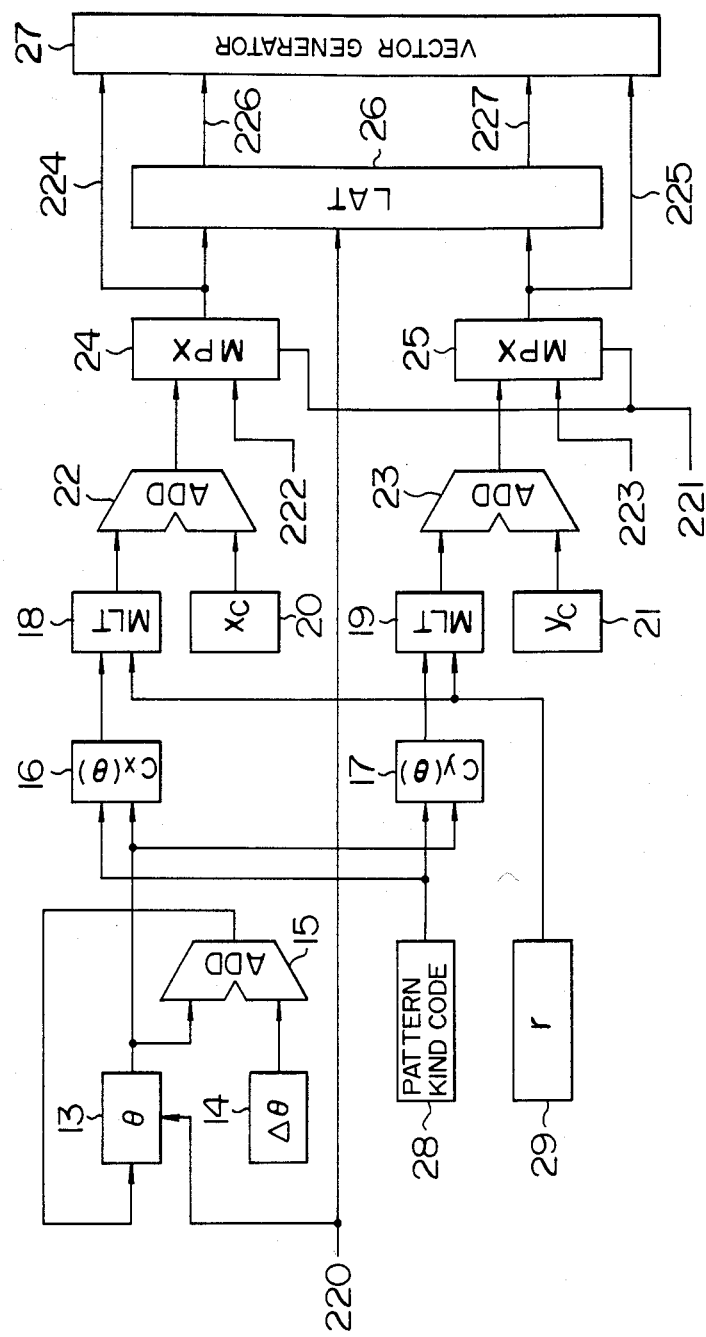
FIG. 5 shows the vector generator circuit and the curve generator circuit included in the framing pattern generator 3.

Generation of curves will now be described. Curves can be approximated by polygon. Accordingly, it is possible to generate curves with polygon approximation by using a polygon generator and a vector generator. As an example of polygon approximation for a curve, polygon approximation of a circle will now be described by referring to FIG. 4A. Assuming that the coordinates of the center O is $(x_c, y_c)$, the circle having radius r can be represented as $$x = r \cos \theta + x_c \quad (1)$$

$$y = r \sin \theta + y_c \quad (2)$$

where $\theta$ denotes a parameter. As shown in FIG. 4A, therefore, the polygon approximation of the circle becomes possible by regarding a point $P_0$ located on the circumference at $\theta = 0$ ($x_0 = r + x$, $y_0 = y_c$) as the start point and by successively connecting points $P_1$, $P_2$, $P_3$, ... located on the circumference respectively at $\theta$ increased $\Delta\theta$ by $\Delta\theta$. It is possible to obtain a sufficiently smooth circle by making $\Delta\theta$ small. The above described polygon approximation of a circle can be implemented by using a circuit shown in FIG. 5. In FIG. 5, numeral 13 denotes a register for holding the value of $\theta$, numeral 14 a register for holding an increment $\Delta\theta$ of $\theta$, and numeral 15 denotes an adder for adding $\Delta\theta$ to $\theta$ to produce a new value of $\theta$. Numerals 16 and 17 denote coefficient memories to which access is gained commonly thereto by $\theta$ to obtain $\cos \theta$ and $\sin \theta$, respectively. Numeral 29 denotes a register for holding the radius r of the circle. Numerals 18 and 19 denote multipliers for multiplying the coefficients $\cos \theta$ and $\sin \theta$ respectively outputted from the coefficient memories 18 and 19 by the radius r of the circle and for thereby producing values of the terms of $r\cos \theta$ and $r\sin \theta$ in the expressions (1) and (2), respectively. Numerals 20 and 21 denote registers for holding values of the coordinates $x_0$ and $y_0$ of the center of the circle, respectively. Numerals 22 and 23 denote adders for adding $r\cos \theta$ outputted from the multiplier 18 and $r\sin \theta$ outputted from the multiplier 19 respectively to the outputs $x_c$ and $y_c$ of the registers 20 and 21 and for thereby producing the coordinates (x, y) of the point located on the circumference at the angle $\theta$ in accordance with the expressions (1) and (2). Numeral 27 denotes a vector generator. Numeral 26 denotes a latch for temporarily holding the coordinate of the start point to be supplied to the vector generator 27. Numerals 24 and 25 denote multiplexers for selecting sources of the coordinates of the start point and the coordinates of the end point to be supplied to the vector generator 27. Numeral 221 denotes a signal so controlled by the sequence control circuit as to specify the selection in the multiplexers 24 and 25. During the polygon approximation operation of a curve, the outputs of the adders 22 and 23 are selected by the signal 221. During the generation of framing lines of a polygon, x coordinate 222 and y coordinate 223 of a vertex are selected by the signal 221. The outputs of the multiplexers 24 and 25 are supplied to the vector generator 27 as the coordinates of the start point or the end point. Numeral 28 denotes a register for holding the pattern kind code and for supplying its output to the upper addresses of the coefficient memories 16 and 17 to select coefficients corresponding to the kind of a pattern to be polygon approximated.

The polygon approximation of a circle performed in the apparatus of FIG. 5 will now be described. It is now assumed that at first, O, $\Delta\theta$, $x_c$, $y_c$, the pattern kind code (circle) and r are already set in the registers 13, 14, 20, 21, 28 and 29, and outputs of the adders 22 and 23 are selected in the multiplexers 24 and 25. Since under this state the output $\theta$ of the register 13 is O, the coefficient memories 16 and 17 output 1 and O, respectively. Accordingly, the adder 22 outputs $r + x_c$, and the adder 23 outputs $y_c$. As a result, the coordinates of $P_0$ shown in FIG. 4A are obtained as the outputs of the multiplexers 24 and 25. Succeedingly, a clock pulse 220 is generated to latch the coordinates of $P_0$ into the latch 26 and add $\Delta\theta$ to the contents of the register 13. The contents of the register 13 are thus replaced by $\Delta\theta$. Under this state, the adders 22 and 23 send out the coordinates of $P_1$ represented as $$x_1 = r \cos \theta + x_c$$

$$y_1 = r \sin \theta + y_c$$

where $\theta = \Delta\theta$. The x coordinate x and the y coordinate y of the point $P_0$ are respectively supplied to inputs 226 and 227 of the vector generator 27 as the coordinates of the start point. Meanwhile, the x coordinate $x_1$ and the y coordinate $y_1$ of the point $P_1$ are respectively supplied to inputs 224 and 225 of the vector generator as the coordinates of the end point. By starting the vector generator 27, therefore, a segment of a line connecting $P_1$ to $P_2$ can be generated. Upon the appearnace of the next clock pulse 220, the latch 26 sends out coordinates $(x_1, y_1)$ of $P_1$. On the other hand, the contents of the register 13 are updated to be $2\Delta\theta$ as a result of addition of $\Delta\theta$ in the adder 15. Accordingly, coordinates $(x_2, y_2)$ of $P_2$ are supplied to the lines 224 and 225. The start point and the end point of the vector generator 27 thus become $P_1$ and $P_2$, respectively. By starting the vector generator, therefore, a segment of a line connecting $P_1$ to $P_2$ can be generated. By repeating this procedure, the circle can be generated as a result of polygon approximation as shown in FIG. 4A. The means for generating a curve with polygon approximation by using the polygon generator and the vector generator has heretofore been described by taking a circle as an example. Assuming that $\theta$ is a parameter, however, many curves can be represented in the form of $$x = r\, C_x(\theta) + x_c$$

$$y = r\, C_y(\theta) + y_c$$

Figure 4B:
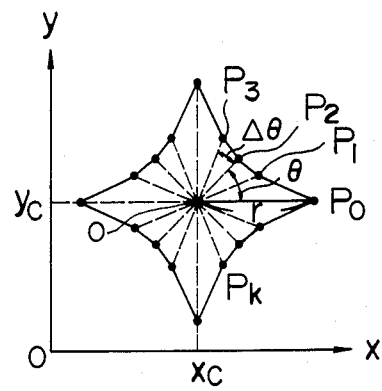
FIG. 4B shows polygon approximation of asteroid curves.

By storing the coefficients $C_x(\theta)$ and $C_y(\theta)$ corresponding to respective curves into the coefficient memories 16 and 17 of FIG. 5, therefore, various curves can be generated with polygon approximation. When $C_x(\theta)$ $=\cos^3\theta$ and $C_y(\theta)=\sin^3\theta$ are stored, for example, the polygon approximation of asteroid curves can be performed as shown in FIG. 4B. If $C_x(\theta)$ and $C_y(\theta)$ are so defined as to fit to an arbitrary curve and are stored into the coefficient memories, that arbitrary curve can be generated as a result of polygon approximation.

Figure 7A:
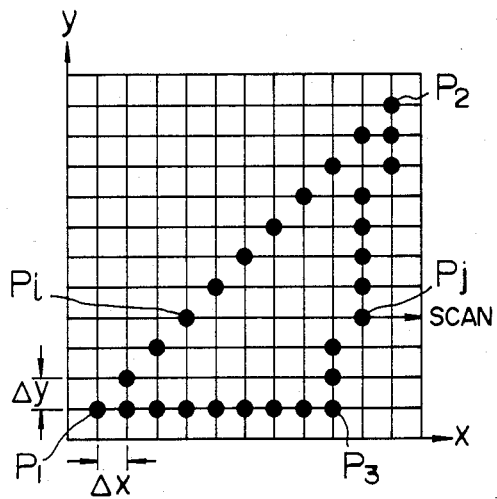
FIGS. 7A and 7B show examples of results of write operation into the framing pattern memory.
Figure 7B:
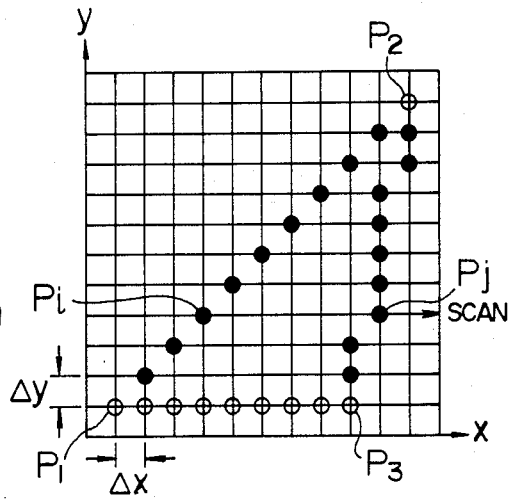
Figure 6:
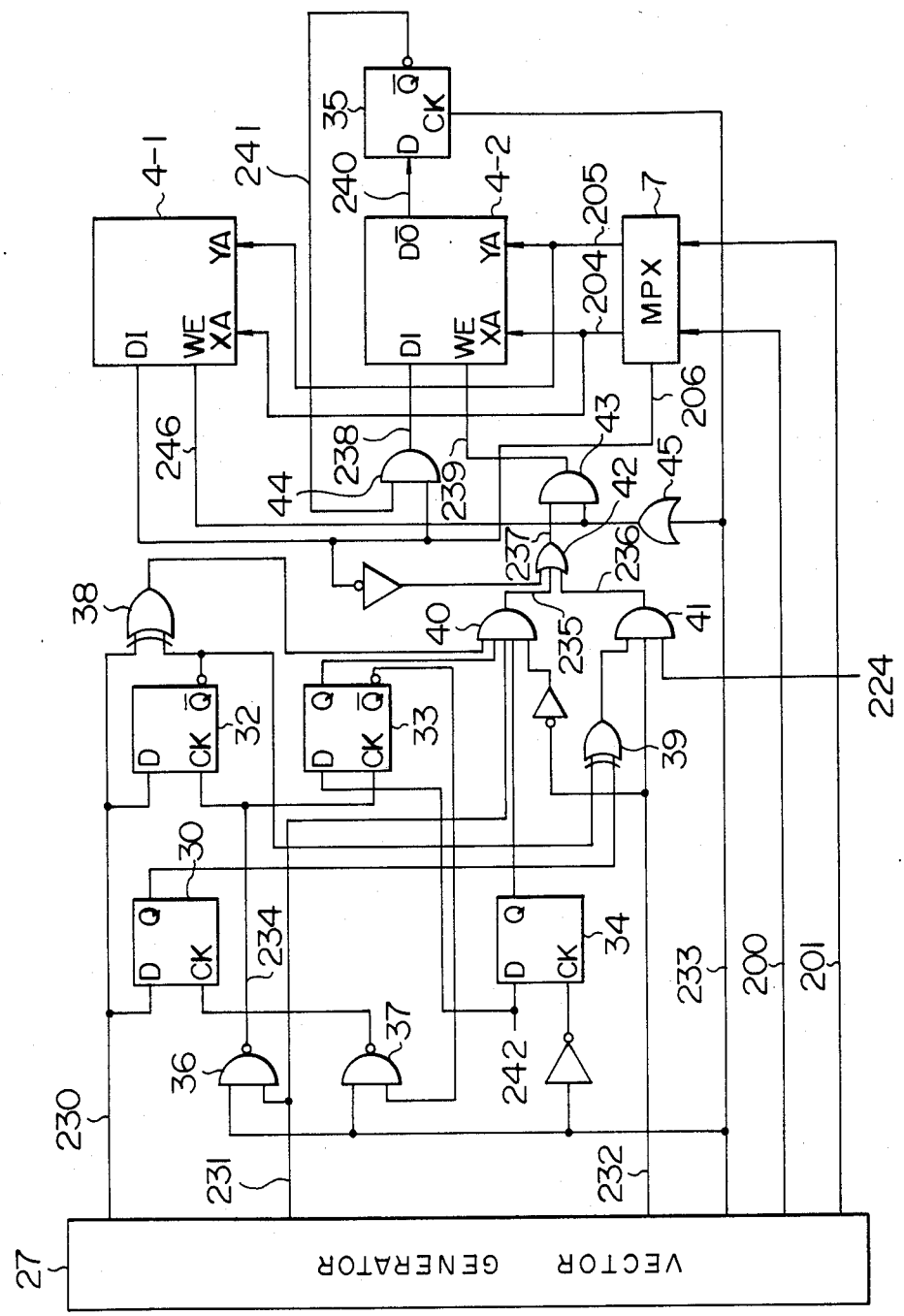
FIG. 6 shows a framing pattern memory write control circuit included in the framing pattern generator 3 of FIG. 1.

The write operation of framing lines into the framing pattern memory will now be described by referring to FIGS. 6, 7A and 7B. As shown in FIG. 6, the framing pattern memory includes a first plane 4-1 and a second plane 4-2. The framing lines of the pattern to be drawn are stored into the first plane 4-1 as they are. Control information for emitting the beam only to the inside of the framing lines is written into the second plane 4-2. FIGS. 7A and 7B show results obtained by writing framing lines of a triangle having vertexes $P_1$, $P_2$ and $P_3$ into the first plane 4-1 and the second plane 4-2 of the framing pattern memory. The write operation of framing lines will now be described in detail by referring to FIG. 6.

It is now assumed that both the first plane 4-1 and the second plane 4-2 of the framing pattern memory are cleared to be "0" in the beginning. The write operation for the first plane 4-1 is achieved by always writing "1" in accordance with x coordinate 200 and y coordinate 201 generated by the vector generator 27. On the other hand, the write operation for the second plane 4-2 is performed in accordance with rules described below.

(1) When the address of a dot succeeding the dot to be written is obtained by updating y, and the updating has the same direction as the preceding updating of y, i.e., both updating are represented as either $+\Delta y$ or $-\Delta y$ (where $\Delta y$ is an increment), the contents of the second plane 4-2 of the framing pattern memory specified by the above described address are read out. The contents thus read out are inverted and written again into the second plane of the framing pattern memory specified by the same address.

(2) In straight lines constituting a framing line, the start point of each individual segment of line is written into the second plane provided that the rule (1) is satisfied. However, the end point is not written into the second plane.

(3) However, the first point to be written first of the framing line (the start point of the first segment of line) is not written into the second plane. However, the last point to be written last (the end point of the last segment of line) is written into the second plane only when the direction of the first updating of the y address agrees with the direction of the preceding updating of the y address.

All dots are written into the second plane 4-2 in accordance with the above described rule (1). The rules (2) and (3) are auxiliary rules for implementing a frame pattern generator according to the rule (1). When the start point of a segment of line (which agrees with the end point of the immediately preceding segment of line) is to be written, it is possible to determine whether the start point can be written or not. Because it is possible to store whether preceding updating of y address is present or not and the direction of the updating (distinguishment between $+\Delta y$ and $-\Delta y$), and it is also possible to obtain from the vector generator the information concerning whether the updating of y address in generation of a dot immediately succeeding the start point is present or not and its direction. In writing the end point of a segment of line, however, it is not possible to judge whether the end point can be written or not. Because it is not possible to obtain whether updating of y address in generation of a dot immediately succeeding the end point is present or not and the direction unless the vector generator 27 starts the operation of generating the next segment of line. Therefore, the rule (2) has been established. In writing the first dot to be written first of the framing line (which is the start point of the first segment of line and agrees with the end point of the last segment of line), it is not possible to obtain the information concerning whether immediately preceding updating of y address is present or not and its direction. Therefore, the first dot is written into the second plane as the end point of the last segment of line instead of as the start point of the first segment of line. At this time, the information concerning whether updating of y address in generation of the next dot is present or not and the direction may be preserved when the first segment is generated. Accordingly, the rule (3) has been established.

The function of writing framing lines into the framing pattern memory in accordance with the above described rules (1), (2) and (3) is achieved by a circuit shown in FIG. 6. In FIG. 6, numeral 27 denotes a vector generator. Numerals 200 and 201 denote x address and y address of the framing pattern memory where a dot is to be written. Numeral 231 denotes a signal indicating whether updating of y address in generation of the address of a location where the next dot to be written is present or not. The signal 231 assumes "1" if the updating is present and assumes "0" if the updating is not present. Numeral 230 denotes a signal indicating the direction of updating of y address. The signal 230 assumes "0" if the address is updated to be $y+\Delta y$ and assumes "1" if the address is updated to be $y-\Delta y$. Numeral 233 denotes a write pulse for writing a dot into the framing pattern memory in accordance with the address indicated by 200 and 201. Numeral 232 denotes a signal which assumes "1" only when the dot to be written is the end point of a segment of line. Numeral 34 denotes a flip-flop for discriminating one dot to be written first of the framing line. A signal assuming always "1" is connected to the data input of the flip-flop 34. A signal obtained by inverting the polarity of the write pulse into the framing pattern is connected to the clock input of the flip-flop 34. The flip-flop 34 is reset to "0" before the framing line is written and set to "1" at the trailing edge of the first write pulse for the framing pattern memory generated by the vector generator 27. As a result, the output of the flip-flop 34 is kept at "0" during the write operation of the first dot of the framing line. Numeral 30 denotes a flip-flop for holding the direction of the first y updating. The signal 230 indicating the direction of y address updating generated by the vector generator 27 is connected to the data input of the flip-flop 30. The output of a NAND gate 37 is connected to the clock input of the flip-flop 30. Until the first updating of y address is performed, a signal obtained by inverting the polarity of the framing pattern memory write pulse is applied to the clock input of the flip-flop 30. After the first updating of y address, however, the application of clock is inhibited by the NAND gate 37. Therefore, the direction of the first y address updating is maintained. Numeral 33 denotes a flip-flop for judging whether the y address has been updated or not after the start of a write operation of the framing pattern. A signal 242 assuming always "1" is connected to the data input of the flip-flop 33. The output 234 of a NAND gate 36 is connected to the clock input of the flip-flop 33. The NAND gate 36 is supplied with the signal 231 generated by the vector generator so as to indicate whether updating of y address is present or not and the framing pattern memory write pulse 233. Only when updating of y address is present, a signal obtained by inverting the polarity of the framing pattern memory write pulse is sent out as the output of the NAND gate 36. The flip-flop 33 assumes the reset state "0" under the initial condition and is set to "1" after the first y address updating. Numeral 32 denotes a flip-flop for holding the direction of immediately preceding updating of y address. The signal 230 generated by the vector generator so as to indicate the direction of y address updating is connected to the data input of the flip-flop 32. The clock input of the flip flop 32 is common to the flip-flop 33. The contents of the flip-flop 32 are updated whenever the y address is updated. At all times, the direction immediately preceding y address updating is maintained. Numeral 38 denotes an EOR gate. The signal 230 generated by the vector generator 27 so as to indicate the direction of y address updating and the polarity-inverted output of the flip-flop 32 are connected to inputs of the EOR gate 38. The continuity of the direction of y address updating is examined and outputted by the EOR gate 38. That is to say, the output of the EOR gate 38 becomes "1" provided that the direction of the present y address updating agrees with the direction of immediately preceding y address updating. The output of the EOR gate 38 becomes "0" in case of disagreement. Numeral 39 denotes an EOR gate. The output of the flip-flop 30 and the polarity-inverted output of the flip-flop 32 are connected to inputs of the EOR gate 39. If the direction of the first y address updating agrees with the direction of immediately preceding y address updating, the EOR gate 39 outputs "1". In case of disagreement, the EOR gate outputs "0". Numeral 35 denotes a latch. At the leading edge of the framing pattern memory write pulse outputted by the vector generator, the latch 35 temporarily latches data 240 read out from the second plane 4-2 of the framing pattern memory. The polarity-inverted output of the latch 35 is connected to an input of an AND gate 44. Numeral 206 denotes a signal controlled by the drawing sequence control circuit. The signal 206 is connected to the data input of the first plane 4-1 of the framing pattern memory, another input of the AND gate 44, and the selection signal input of a multiplexer 7. The signal 206 is also connected to an input of an OR gate 42 via a NOT gate. While framing lines are written into the framing pattern memory, the signal 206 is always kept at "1". By the multiplexer 7, therefore, the addresses 200 and 201 generated by the vector generator are selected to be supplied to the framing pattern memory as x address 204 and y address 205. The write data of the first plane 4-1 of the framing pattern memory is fixed to "1". The write data 238 of the second plane 4-2 is obtained by inverting the polarity of the readout data 240 of the second plane. The x address 204 is controlled by the drawing sequence control circuit and is always kept at "1" only during the write operation of the last segment of line constituting the framing line.

In FIG. 6, the write operation of the framing line into the framing pattern memory is performed as follows. The input data of the first plane 4-1 of the framing pattern memory is fixed to "1". As a write pulse 246, the write pulse 233 generated by the vector generator 27 is supplied as it is. Accordingly, the framing line of the pattern to be drawn is written into the first plane 4-1 as it is. On the other hand, the input data of the second plane 4-2 of the framing pattern memory is the polarity-inverted signal with respect to the readout data. It is determined by outputs of AND gates 40 and 41 whether the input data can be written into the second plane or not. Outputs 235 and 236 of the AND gates 40 and 41 are connected to inputs of the OR gate 42. The remaining input of the OR gate 42 is the signal obtained by inverting the polarity of 206. During the write operation of the framing line, the remaining input of the OR gate 42 is kept at "0" and hence the output of the OR gate 42 becomes "1". Accordingly, the data input is written into the second plane 4-2 of the framing pattern memory only when either one of outputs 235 and 236 of the AND gates 40 and 41 turns to "1". The AND gate 41 judges in accordance with the above described rule (3) whether the last dot of the framing line can be written into the second plane or not. The AND gate 40 judges in accordance with the rules (1), (2) and (3) whether other dots can be written into the second plane or not. An example of the result of the write operation for the framing pattern memory by the circuit illustrated in FIG. 6 is shown in FIGS. 7A and 7B. The pattern to be drawn is the triangle shown in FIG. 2A. FIG. 7A shows the result of writing dots into the first plane 4-1 of the framing pattern memory. FIG. 7B shows the result of writing dots into the second plane 4-2 of the framing pattern memory.

The drawing operation performed by scanning the framing pattern memory will now be described. At first, the drawing method will be described by referring to FIGS. 7A and 7B. The framing lines of the triangle illustrated in FIG. 2A are written into the framing pattern memory in accordance with the rules (1), (2) and (3) as shown in FIG. 7A. The drawing is performed by scanning the framing pattern memory with framing lines written therein in the x direction. That is to say, the beam deflection address is generated to scan the beam corresponding to the scanning of the framing pattern memory. The beam is alternately turned on and off whenever the data read out from the second plane of the framing pattern memory becomes "1". And the beam is always in an "on" state on framing lines of the first plane. Thereby, drawing is so performed as to fill in the inside of framing lines including the framing lines. In the example of FIG. 7B, the beam is turned on by reading out $P_i$, and then the beam is turned off by reading out $P_j$. After one scan has been finished, the y address is updated to perform the next scan. When the entire surface of the framing pattern memory has been scanned, the drawing is completed.

Figure 8:
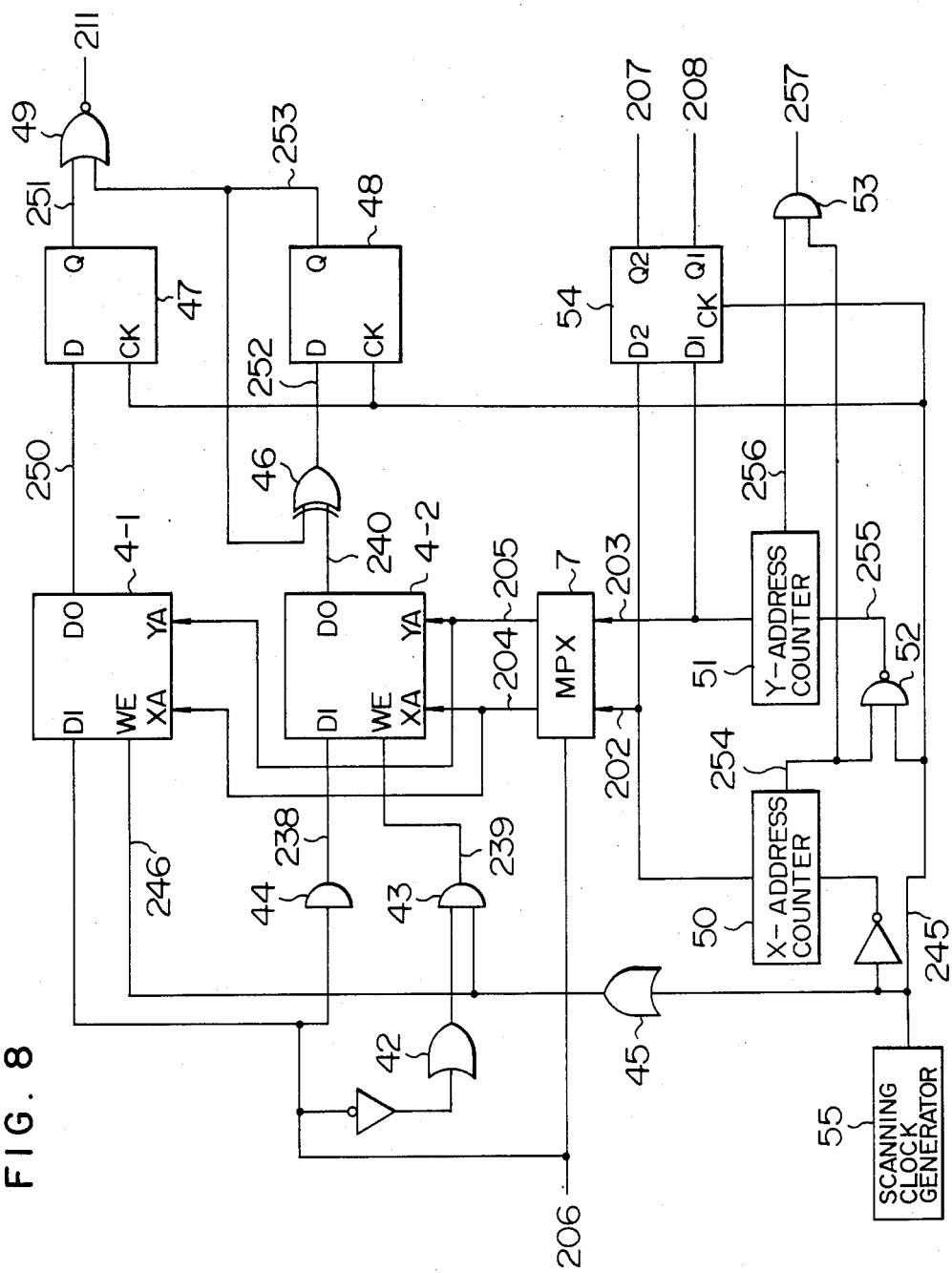
FIG. 8 shows the internal configuration of a raster scanning circuit illustrated in FIG. 1.

The drawing using the above described method can be achieved by a circuit illustrated in FIG. 8. In FIG. 8, numeral 55 denotes a scanning clock generator for supplying scanning clocks 245 to the present circuit. Numeral 50 denotes an x address counter for generating scanning x address of the framing pattern memory and beam deflection x address. The value of the x address counter 50 is increased by $\Delta x$ at the trailing edge of the scanning clock 245. When the value of the x address counter has reached the maximum value of the x address of the framing pattern memory, a signal 254 turns to "1". The x address counter 50 is reset to "0" at the next scanning clock. Numeral 52 denotes a NAND gate. Only under the state that the signal 254 assumes "1", the NAND gate 52 issues a count-up pulse 255 to a y address counter 51 to increase the contents of the y address counter 51 by $\Delta y$. When the contents of the y address counter 51 have reached the maximum value of the y address of the framing pattern memory, the y address counter 51 turns the signal 256 to "1". Numeral 47 denotes a flip-flop for latching the data read out from the first plane 4-1 of the framing pattern memory by the leading edge of the scanning clock to temporarily hold the data. Numeral 48 denotes a flip-flop for keeping the "on" state of the beam inside the framing lines. The data read out from the second plane of the framing pattern memory and the data stored in the flip-flop 48 undergo exclusive-OR operation in an EOR gate 46. The result of the exclusive-OR logic is supplied to a data input 252 of the flip-flop 48. The contents of the flip-flop 48 is updated by the leading edge of the scanning clock. Numeral 54 denotes a latch. Upon the appearance of the leading edge of the scanning clock 245, the latch 54 latches an output 202 of the x address counter and an output 203 of the y address counter to output them as x address 207 and beam deflection y address 208. Numeral 206 denotes a signal controlled by the drawing sequence control circuit. During the raster scanning, the signal 206 is kept at "0". In a multiplexer 7, therefore, the signals 202 and 203 are selected as an x address 204 and a y address 205 of the framing pattern memory, respectively. And the data input of the framing pattern memory is kept at "0" for both the first plane 4-1 and the second plane 4-2. The scanning clock 24 is supplied to the framing pattern memory as a write pulse. Whenever the framing pattern memory is scanned and one-dot data is read out for drawing that dot can be cleared to "0". After the raster scanning has been finished the framing line of the next pattern to be drawn can be immediately written.

In FIG. 8, the raster scanning for drawing is performed as follows. It is now assumed that in the initial state the x address counter 50, the y address counter 51, the latch 47 and the latch 48 are reset to "0". The drawing sequence controller turns 206 to "1", and the scanning clock generator 55 is started. The scanning clocks 245 thus begin to be generated, and the scanning of the framing pattern memory is started to perform the drawing. As an example of operation timing, FIGS. 9A to 9G show operation timing in a case where a line including the dots $P_i$ and $P_j$ illustrated in FIGS. 7A and 7B is scanned. The flip-flop 48 turns to "1" upon readout of $P_i$ and is kept in the state "1" until $P_j$ is read out. Upon readout of $P_j$, the flip-flop 48 returns to "0". A beam blanking signal 211 is obtained by applying the logical OR to outputs of the latches 47 and 48 in a NOR gate 49 and by inverting the polarity of the result. During the scanning operation lasting from $P_i$ to $P_j$ and including $P_i$ and $P_j$, the beam is in the "on" state to cause exposure. The completion of drawing is detected by the fact that both the x address counter 50 and the y address counter 51 reach the maximum address of the framing pattern memory and hence an output 257 of an AND gate 53 turns to "1". The drawing sequence controller is informed of the completion of drawing thus detected. The drawing sequence controller thus informed stops the scanning clock generator 55 to finish the raster scanning for drawing.

The raster scanning for drawing performed in the x direction has heretofore been described. The raster scanning for drawing in the y direction can be achieved by examining the continuity of the direction of x address updating in writing framing lines into the framing pattern memory instead of examining the continuity of the direction of y address updating.

As heretofore described, the drawing in accordance with the present invention is performed by first writing framing lines of a desired pattern into the framing pattern memory by means of the framing pattern generator, then scanning the framing pattern memory, and turning the beam on only inside the framing lines including the framing lines. Since curves can also be written into the framing pattern memory by means of polygon approximation in the framing pattern generator, special shaped patterns including curves can also be drawn at high speed.

In the embodiment heretofore described, only one framing pattern memory was used. For the same framing pattern memory, write operation of the framing line and the raster scanning for drawing cannot be carried out at the same time. In case one framing pattern memory is used, therefore, the write operation and the raster scanning for drawing must be executed serially. If a plurality of framing pattern memories are disposed, the write operation of framing lines and the raster scanning for drawing can be made in parallel. As a result, the drawing speed is further improved.

FIG. 10 shows an embodiment having a plurality of framing pattern memories. In FIG. 10, numeral 4A denotes a first framing pattern memory and numeral 4B denotes a second framing pattern memory. Numeral 3 denotes a framing pattern generator and numeral 5 denotes a raster scanning circuit for drawing. Numeral 56 denotes a changeover switch for connecting the framing pattern generator 3 to either the framing pattern memory 4A or the framing pattern memory 4B. Numeral 57 denotes a changeover switch for connecting the raster scanning circuit for drawing to either the framing pattern memory 4A or the framing pattern memory 4B. When the framing pattern generator 3 of FIG. 10 is connected to the framing pattern memory 4A by the changeover switch 56, the raster scanning circuit for drawing 5 is connected to the framing pattern memory 4B by the changeover switch 57. On the contrary, the raster scanning circuit 5 is connected to the framing pattern memory 4A when the framing pattern generator 3 is connected to the framing pattern memory 4B. While one of the framing pattern memories is scanned to draw the pattern, it is thus possible to write framing lines of the next pattern to be drawn. As a result, the drawing speed is improved.

The framing pattern memory must be disposed corresponding to the beam scanning region. However, it is not necessarily required to perform the scanning of the framing pattern memory for drawing over the entire face of the framing pattern memory. It is satisfactory to scan only the region including the framing lines of the pattern to be drawn. It is suitable to choose a rectangular region as the scanning region by reason of easy implementation.

As an example, FIG. 11 shows the relation between the entire scanning region of the framing pattern memory and a rectangular scanning region required for drawing (hereafter referred to as raster scanning region for drawing) assuming that the pattern to be drawn is a triangle. In FIG. 11 numeral 400 denotes framing lines of the triangle which is a pattern to be drawn. Numeral 401 denotes a scanning region for drawing, and numeral 402 denotes an entire scanning region. The triangle can be sufficiently drawn by scanning only the raster scanning region 401. In this case, useless scanning is reduced as compared with the case where the entire scanning region 402 is scanned, resulting in an improvement drawing speed. By detecting the minimum values and the maximum values of the write address when writing the framing lines into the framing pattern memory, the raster scanning region for drawing can be established as a rectangular region whose diagonal line is a segment of line connecting a point specified by the minimum values of the x address and y address to another point specified by the maximum values of the x address and y address.

Figure 13:
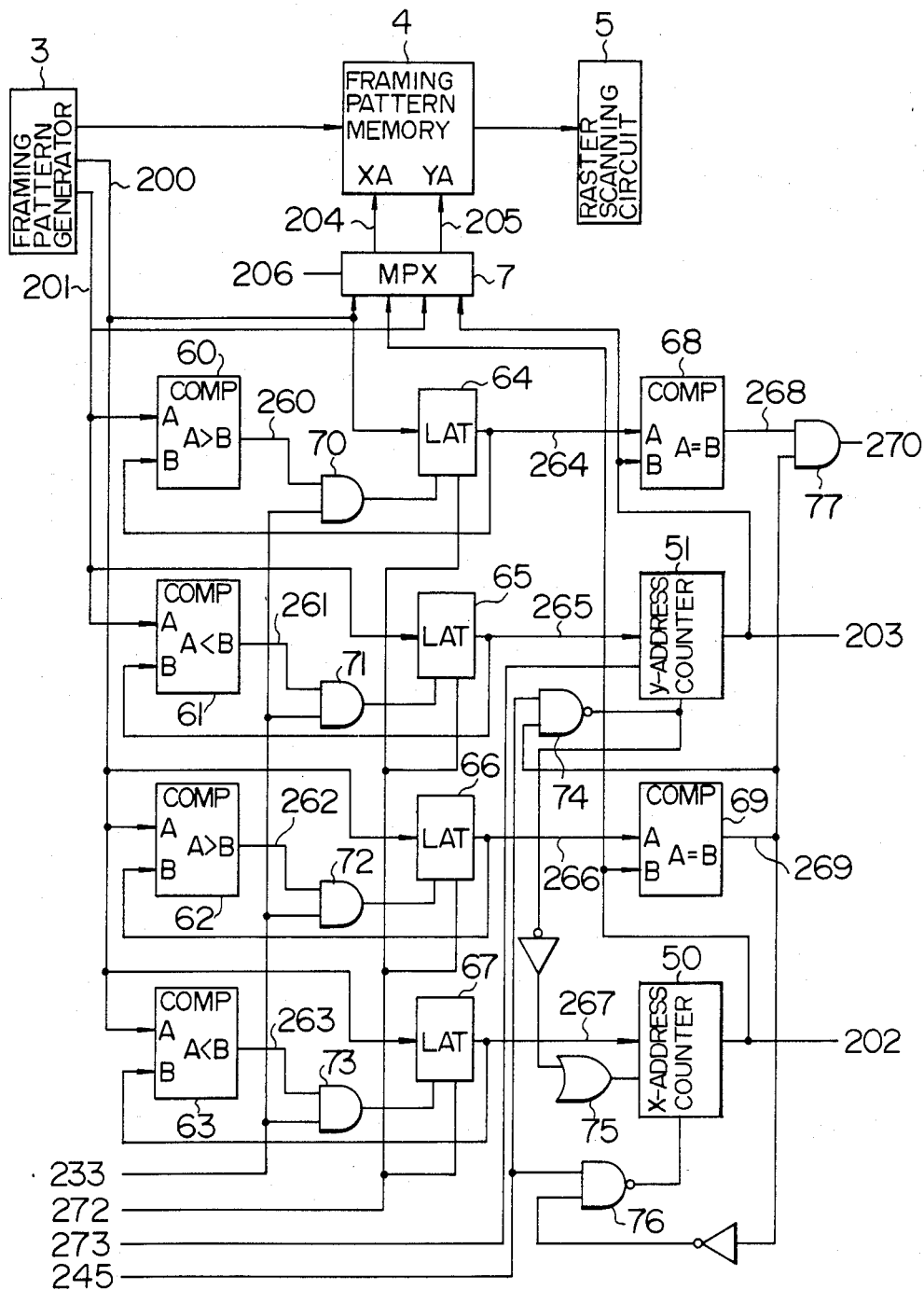
FIG. 13 shows a circuit for performing the detection of the actual raster scanning region for drawing and scanning of the actual raster scanning region for drawing.

FIG. 13 shows an embodiment of such a case. Numerals 64 and 65 denote latches for holding the maximum value and the minimum value of the y address, respectively. Prior to writing the framing lines, the latches 64 and 65 are respectively reset to 0 and the maximum value of the y address of the framing pattern memory by a reset signal 272. Numerals 66 and 67 denote latches for holding the maximum value and the minimum value of the x address. Prior to writing the framing lines, the latches 66 and 67 are respectively reset to 0 and the maximum value of the x address of the framing pattern memory by the reset signal 272. Numeral 60 denotes a comparator. Two inputs of the comparator 60 are connected to the y address 201 of the framing pattern memory generated by the vector generator 3 and an output 264 of the latch 64 holding the maximum value of the y address, respectively. The comparator 60 compares the magnitudes of the two inputs, and turns the output 260 to "1" when the magnitude of the input 201 is larger than that of the input 264. Numeral 61 denotes a comparator. Two inputs of the comparator 61 are connected to the y address 201 of the framing pattern memory generated by the vector generator and an output 265 of the latch 65 holding the minimum value of the y address, respectively. The comparator 61 compares the magnitudes of the two inputs, and turns the output 261 to "1" when the magnitude of the input 201 is smaller than that of the input 265. Numeral 62 denotes a comparator. Two inputs of the comparator 62 are connected to the x address 200 of the framing pattern memory generated by the vector generator and an output 266 of the latch 66 holding the maximum value of the x address, respectively. The comparator 62 compares the magnitudes of the two inputs, and turns the output 262 to "1" when the magnitude of the input 200 is larger than that of the input 266. Numeral 63 denotes a comparator. Two inputs of the comparator 63 are connected to the x address 200 of the framing pattern memory generated by the vector generator and an output 267 of the latch 67 holding the minimum value of the x address, respectively. The comparator 63 compares the magnitudes of the two inputs, and turns the output 263 to "1" when the magnitude of the input 200 is smaller than that of the input 267. Numeral 50 denotes an x address counter. The input of the x address counter is connected to the output 267 of the latch 67 holding the minimum value of the x address. An output 202 of the x address counter 50 is connected to an input of the multiplexer 7 to supply the scanning address of the framing pattern memory thereto. The output 202 also supplies the beam deflection x address. Numeral 69 denotes a comparator. Two inputs of the comparator 69 are connected to the output 266 of the latch 66 holding the maximum value of the x address and the output 202 of the x address counter 50, respectively. The comparator 69 detects whether the output 266 agrees with the output 202 or not. Numeral 51 denotes a y address counter. The input of the y address counter 51 is connected to the output 265 of the latch 65 holding the minimum value of the y address. An output 203 of the y address counter 51 is connected to an input of the multiplexer 7 to supply the scanning address of the framing pattern memory thereto. The output 203 also supplies the beam deflection y address. Numeral 68 denotes a comparator. Two inputs of the comparator 68 are connected to the output 264 of the latch 64 and the output 203 of the y address counter 51. The comparator 68 detects whether the output 264 agrees with the output 203 or not.

In the circuit illustrated in FIG. 13, the detection of the raster scanning region for drawing and the scanning of the raster scanning region for drawing are performed as follows. At first, the detection of the raster scanning region will now be described. Prior to writing framing lines, a reset signal 272 shown in FIG. 13 is issued. Both the latches 64 and 66 are reset to zero by the reset signal 272. The latches 65 and 67 are reset respectively to the maximum value of the y address of the framing pattern memory and the maximum value of its x address by the reset signal 272. After the write operation of framing lines has been started, the maximum value of the y address (the initial value is 0) latched in the latch 64 is compared with the address 201 of a location whereto the dot is to be written by the comparator 60 whenever the address of a location whereto the dot is to be written is generated. If the value of 201 is larger than the maximum value of y address, the output 260 of the comparator 60 turns to "1". Accordingly, the dot write pulse 233 is applied to the latch 64 via an AND gate 70 as a latch pulse. As a result, the y address whereto the dot is to be written is latched into the latch 64 as a new maximum value of the y address. If, on the contrary, the value of 201 is not larger than the maximum value of y address latched in the latch 64, the output 260 of the comparator 60 turns to "0". Accordingly, the application of the latch pulse is inhibited by the AND gate 70. Therefore, the maximum value of y address is preserved. As a result of operation heretofore described, the maximum value of y address is detected in the latch 64 when the framing line write operation is finished. The operation for the minimum value of y address is performed in a similar way. That is to say, the minimum value of y address latched in the latch 65 (its initial value is the maximum value of y address of the framing pattern memory) is compared with the y address of a location whereto the dot is to be written by the comparator 61 whenever the address of a location whereto the dot is to be written is generated. If the y address of a location whereto the dot is to be written is smaller than the minimum value of y address, the output 261 of the comparator 61 turns to "1". Accordingly, a latch pulse is applied to the latch 64 via an AND gate 71 to update the minimum value of the y address. As a result of operation heretofore described, the minimum value of y address is detected in the latch 65 when the operation of writing the framing lines is finished. The maximum value and the minimum value of x address are detected in perfectly the same way. And the maximum value of x address and the minimum value of x address are obtained in the latch 66 and the latch 67, respectively.

The scanning of the raster scanning region for drawing will now be described. Prior to the raster scanning for drawing, a load pulse 273 is generated to load the minimum value of x address and the minimum value of y address respectively into the x address counter 50 and the y address counter 51 as the scanning start address. After the raster scanning for drawing has been started, the scanning clock 245 is issued by one pulse whenever one dot is read out from the framing pattern memory. The x address counter thus counts up. When the contents of the x address counter have agreed with the maximum value of x address held by the latch 66, an output 269 of a comparator turns to "1". Accordingly, a count pulse is supplied to the y address counter 51 via a NAND gate 74 to make the counter 51 count up. At the same time, a load pulse is issued to the x address counter 50 via an OR gate 75 to load the minimum value of x address into the x address counter 50. The raster scanning for drawing is finished when the output of the x address counter becomes equal to the maximum value of x address held in the latch 66 and the output of the y address counter becomes equal to the maximum value held in the latch 64. At this time, outputs of both comparators 68 and 69 turn to "1" and hence an output of an AND gate 77 turns to "1", the end of the raster scanning for drawing being decreased.

As heretofore described, it becomes possible to detect the raster scanning region for drawing and scan the raster scanning region for drawing by using the circuit shown in FIG. 13. As a result, scanning of useless regions which does not contribute to the drawing is reduced and hence the drawing speed is improved.

As one method for improving the dimension precision of a drawn pattern, there is known a method comprising the steps of dividing the pattern to be drawn into a framing part and an internal part and making the exposure of the internal part smaller than that of the framing part. In FIG. 12A, numeral 400 denotes a framing line of a pattern to be drawn, and numeral 501 denotes an exposure boundary which divides the pattern to be drawn into the framing part and the internal part. By making the exposure of a part surrounded by the exposure boundary 501 smaller than that of the framing part located outside, the dimension precision of the drawn pattern can be improved. As shown in FIG. 12B, data of a pattern to be drawn is constituted by adding an exposure time alteration directive command CE, exposure boundary data and an exposure directive command EXP to preceding framing line data of the pattern to be drawn.

Figure 14:
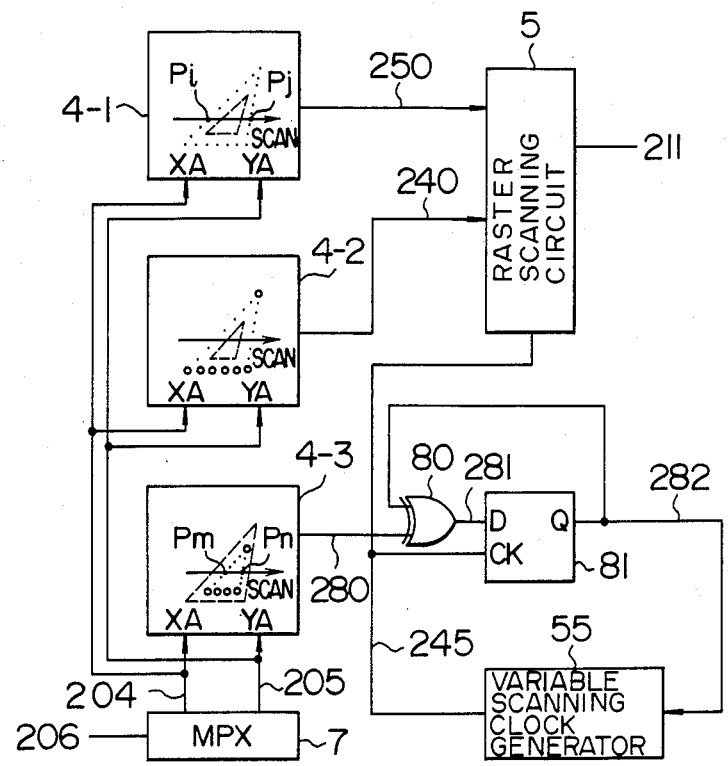
FIG. 14 shows a circuit for applying the raster scanning to a pattern having exposure boundaries.

The function heretofore described can be implemented by a circuit shown in FIG. 14. In FIG. 14, numeral 4-1 denotes the first plane of the framing pattern memory, numeral 4-2 the second plane, and numeral 4-3 denotes a newly added third plane of the framing pattern memory. Only the exposure boundaries are written into the third plane 4-3. The write operation for the third plane 4-3 is performed in accordance with the writing rule for the second plane. An EOR gate 80 and a flip-flop 81 operate in the same way as the EOR gate 46 and the flip-flop 48 of FIG. 8, respectively. In the raster scanning for drawing, an output 282 of the flip-flop 81 turns to "1" inside the exposure boundaries. Numeral 55 denotes a variable scanning clock generator whose clock period is controlled by an output 282 of the flip-flop 81.

In FIG. 14, the drawing is performed as follows. It is now assumed that three planes of the framing pattern memory and the flip-flop 81 are cleared to "0" in the initial state. At first, framing lines of a pattern to be drawn are written into the first and second planes of the framing pattern memory. Succeedingly, the exposure boundaries are written into the third plane in accordance with the writing rule for the second plane. After the exposure boundaries writing has been finished, the framing pattern memory is scanned to draw the pattern.

Numeral 5 denotes a raster scanning circuit for drawing. The circuit 5 operates in the same way as the circuit shown in FIG. 8. For performing the drawing, the raster scanning circuit for drawing 5 turns the beam blanking signal 211 to "0" to emit the beam only inside the framing lines including the framing lines themselves. At this time, the output 282 of the flip-flop 81 turns to "1" only while the inside of exposure boundaries is scanned. The output 282 is connected to a control terminal of the variable scanning clock generator 55 to control the period of the clock. Assuming that the raster scanning for drawing the pattern shown in FIG. 12 is performed by passing through dots $P_i$ and $P_j$ located on the framing lines and dots $P_m$ and $P_n$ located on exposure boundaries, FIGS. 15A to 15G show timing of raster scanning operation for drawing one line performed in the circuit of FIG. 14. In FIGS. 15A to 15G, the scanning clock 245 is controlled to have shorter periods when the output of the flip-flop 81 assumes "1", i.e., when the inside of the exposure boundaries is scanned. Inside the framing lines, the beam is always emitted. Accordingly, the exposure is in proportion to the period of the scanning clock. The shorter the period, the less the exposure. As a result, the exposure inside the exposure boundaries becomes less than that of the peripheral part. When the third plane 4-3 is used as well, "0" is written into an address wherefrom data has been read out and "0" clear is finished at the same time as the end of the raster scanning for drawing in the same way as the first and second planes.

In accordance with the present invention heretofore described, exposure boundaries are written into the third plane disposed in the framing pattern memory, and the inside of the exposure boundaries is detected in the raster scanning for drawing. And the period of the scanning clock is made shorter during the scanning operation performed inside the exposure boundaries. Thereby the exposure inside the exposure boundaries can be made less than that in the peripheral part. As a result, the dimension precision of the drawn pattern can be improved.

Figure 16:
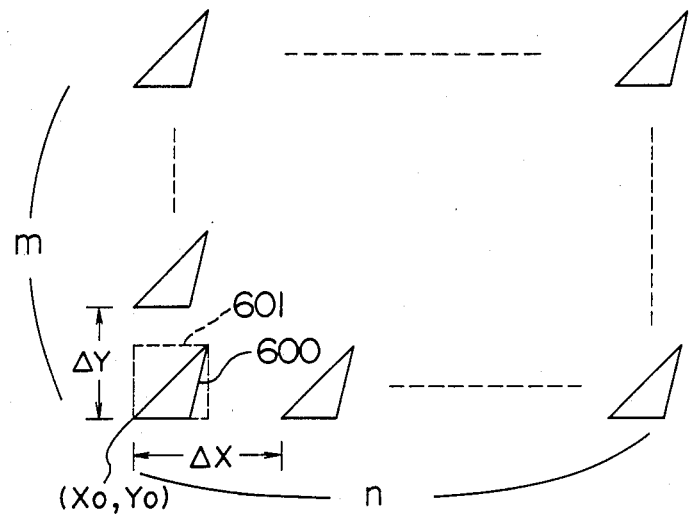
FIG. 16 shows an example of drawing of repeated patterns.

In actually drawn patterns, identical patterns are often drawn repeatedly as in cases of memory devices. If a pattern or a group of patterns forming a unit of repetition is written into the framing pattern memory and an identical framing pattern memory is raster-scanned for drawing repeatedly, the required number of operation of writing the framing lines into the framing pattern memory is only one per pattern or group of patterns forming a unit of repetition. As a result, the drawing speed can be raised. FIG. 16 shows an example of repetition pattern. In FIG. 16, numeral 600 denotes a triangle forming a unit of repetition, and numeral 601 denotes a raster scanning region for drawing the triangle 600. In the x direction, n unit patterns 600 are arranged at an interval of $\Delta X$. In the y direction, m unit patterns are arranged at an interval $\Delta Y$. Unit patterns are thus arranged in a matrix form.

Figure 17:
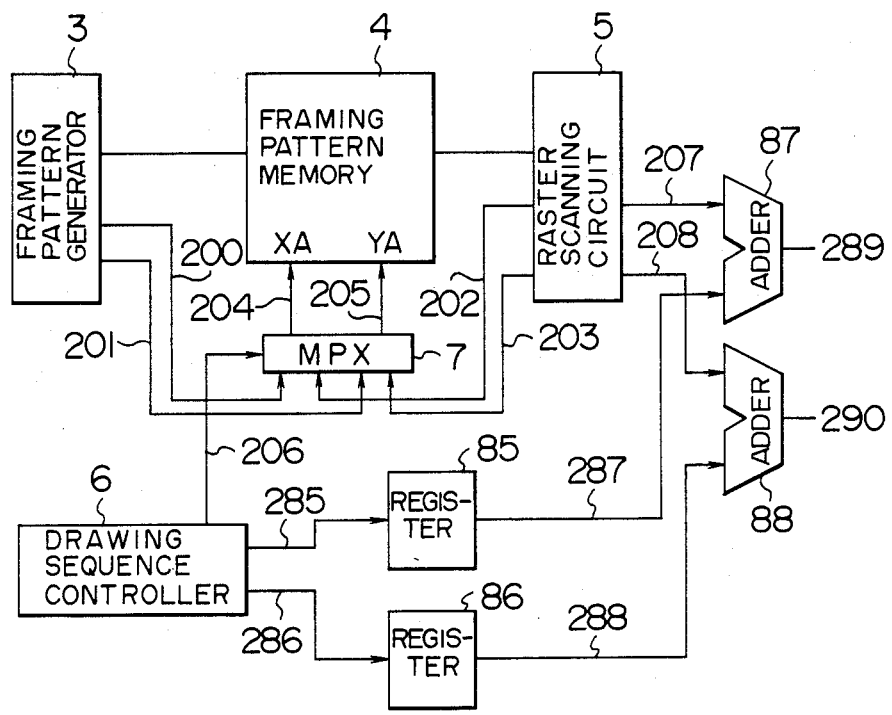
FIG. 17 shows a circuit for applying repetitively the raster scanning for drawing onto the same framing pattern memory and for thereby drawing unit patterns in the array form.

The above described function can be implemented by a circuit illustrated in FIG. 17. In FIG. 17, numerals 85 and 86 denote registers for holding the X address and Y address of a start point of the raster scanning for drawing, respectively. The held address is set by the drawing sequence controller 6. Numeral 87 denotes an adder for adding x address 287 of a base point of raster scanning for drawing to the beam deflection x address 207 to derive final beam deflection x address 289. Numeral 88 denotes an adder for adding y address 288 of a base point of raster scanning for drawing to the beam deflection y address 208 to derive final beam deflection y address 290. In FIG. 17, drawing is performed as follows. At first, framing lines of a repetition unit pattern or a repetition unit group of patterns is written into the framing pattern memory 4 by using the framing pattern generator 3. Succeedingly, the drawing sequence controller 6 writes initial values $X_0$ and $Y_0$ of the base point address of raster scanning for drawing into the registers 85 and 86 and starts the raster scanning circuit for drawing to draw the unit pattern. After the unit pattern has been drawn, the contents of the register 85 are increased by $\Delta X$. The raster scanning circuit for drawing is started again to scan the identical framing pattern memory. The unit pattern is drawn at an interval of $\Delta X$ in the x direction. The above described operation is repeated to drawn n unit patterns at an interval of $\Delta X$ in the x direction. Thereafter, the register 86 is reset to $X_0$, and the contents of the register 86 are increased by $\Delta Y$. By the similar operation, the unit pattern is repetitively drawn n times in the x direction. By repeating the operation heretofore described a required number of times, unit patterns are drawn in the matrix form as shown in FIG. 16. The framing pattern memory 4 is cleared to "0" when the last unit pattern is drawn. In the preceding drawing operation, the contents of the framing pattern memory are preserved.

It has heretofore been described that special shaped patterns can be drawn owing to the present invention. In some cases, it becomes necessary to draw a further complicated compound pattern. For example, FIG. 18C shows a simplified view of a Fresnel zone plane. The pattern shown in FIG. 18C can be regarded as the logical sum of three ring shaped patterns which are concentrically arranged and different in size as shown in FIG. 18A and eight rectangles arranged radially as shown in FIG. 18B. Therefore, framing lines of the pattern shown in FIG. 18A are stored into a first framing pattern memory, and framing lines of the pattern shown in FIG. 18B are stored into a second framing pattern memory. Thereafter, the first framing pattern memory and the second framing pattern memory simultaneously undergo the raster scanning for drawing. Two beam blanking control signals are obtained by applying the raster scanning for drawing to respective framing pattern memories. The beam blanking control is performed by one beam blanking control signal derived by applying logical addition to the resultant two beam blanking control signals. It is thus possible to draw the pattern illustrated in FIG. 18C as a pattern corresponding to logical sum of the patterns illustrated in FIGS. 18A and 18B. The case where two framing pattern memories are used has heretofore been described. By using three or more framing pattern memories, however, a further complicated compound pattern can be drawn.

The function heretofore described can be realized by using a circuit shown in FIG. 19. In FIG. 19, numeral 3 denotes a framing pattern generator, numeral 4A a first framing pattern memory, numeral 4B a second framing pattern memory, numeral 5A a first raster scanning circuit for drawing, numeral 5B a second raster scanning circuit for drawing, numeral 90 an OR gate, and numeral 56 denotes a switch circuit for selectively connecting the framing pattern generator to either the first framing pattern memory 4A or the second framing pattern memory 4B. The drawing operation will now be described by referring to the pattern illustrated in FIG. 18C as an example. At first, the framing pattern generator 3 is connected to the first framing pattern memory 4A via the switch circuit 56 to write framing lines of the pattern illustrated in FIG. 18A. Succeedingly, the framing pattern generator 3 is connected to the second framing pattern memory 4B via the switch circuit 56 to write framing lines of the pattern illustrated in FIG. 18B. Thereafter, the first raster scanning circuit for drawing 5A and the second raster scanning circuit for drawing 5B are started. The first framing pattern memory 4A and the second framing pattern memory 4B thus undergo the raster scanning for drawing simultaneously. A beam unblanking signal 211A outputted from 5A and a beam unblanking signal 211B outputted from 5B are applied to the OR gate 90. The resultant logical sum is outputted as a final beam unblanking signal 211. Thereby, the beam is emitted inside the pattern illustrated in FIG. 18A and inside the pattern illustrated in FIG. 18B. As a result, a pattern corresponding to their logical sum, i.e., the pattern illustrated in FIG. 18C can be drawn.

Owing to the present invention, it becomes possible to draw a special shaped pattern including a polygon having arbitrary angles, a circle, an ellipse, or an arbitrary curve without disassembling it into a combination of basic patterns. This results in an effect of a significantly improvement of drawing speed.

What is claimed is:

1. A lithography apparatus in which a charged particle beam is controlled to scan a desired region of a sample and thereby draw a pattern, comprising:
    a framing pattern memory for storing therein closed framing lines of a pattern to be drawn in the form of dot images having a plurality of dots;
    a framing pattern generator for writing said closed framing lines of the pattern to be drawn into said framing pattern memory in the form of dot images having a plurality of dots; and
    a raster scanning generator including means for generating beam deflection addresses of the pattern to be drawn by scanning said closed framing lines of a pattern stored in said framing pattern memory, means for determining whether each dot in said framing pattern memory corresponding to a beam deflection address is within said closed framing lines and means for generating a beam blanking control signal which turn on the beam only when said dot is within said closed framing lines.

2. A lithography apparatus according to claim 1, further comprising a plurality of framing pattern memories and means for writing closed framing lines of another pattern to be drawn into a second framing pattern memory while a first framing pattern memory is scanned to draw a first pattern.

3. A lithography apparatus according to claim 1, further comprising scanning region registers for specifying a rectangular region as a scanning range of said framing pattern memory, wherein scanning of said framing pattern memory for drawing is performed in said rectangular region specified by said scanning region registers.

4. A lithography apparatus according to claim 1, wherein said framing pattern memory includes a plane for storing boundaries, which identify a closed region contained within a pattern to be drawn, in the form of dot images, and wherein said raster scanning generator includes means for detecting said closed region identified by said boundaries, and means for drawing said identified closed region with an exposure different from that of another closed region of the pattern to be drawn.

5. A lithography apparatus according to claim 1, wherein said raster scanning generator includes a base point address register for holding an address of a base point of a region scanned by a beam corresponding to the scanning of said framing pattern memory, an adder for adding an incremental beam deflection address to the contents of the base point address register and means for outputting the resultant sum as a final beam deflection address, whereby said raster scanning generator draws a pattern having closed framing lines stored in said framing pattern memory in an array form by scanning said framing pattern memory, updating the contents of the base point address register, scanning the framing pattern memory to draw the pattern again, and repeating the above described series of operation.

6. A lithography apparatus according to claim 1, comprising:
- a plurality of framing pattern memories for storing closed framing lines of respective different patterns;
- means for simultaneously raster-scanning a plurality of framing pattern memories; and
- an OR gate for deriving the logical sum of a plurality of beam blanking control signals obtained by simultaneously raster-scanning a plurality of framing pattern memories and for outputting the resultant logical sum as one beam blanking control signal.

* * * * *